(12) United States Patent
Ishiguchi

(10) Patent No.: US 8,736,594 B2
(45) Date of Patent: May 27, 2014

(54) POTENTIAL GENERATION CIRCUIT AND LIQUID CRYSTAL DISPLAY DEVICE

(71) Applicant: Kazuhiro Ishiguchi, Tokyo (JP)

(72) Inventor: Kazuhiro Ishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/716,291

(22) Filed: Dec. 17, 2012

(65) Prior Publication Data

US 2013/0106471 A1  May 2, 2013

Related U.S. Application Data

(62) Division of application No. 12/429,534, filed on Apr. 24, 2009, now Pat. No. 8,373,693.

(30) Foreign Application Priority Data

Apr. 24, 2008 (JP) .................. 2008-113622

(51) Int. Cl.
*G09G 3/36* (2006.01)
(52) U.S. Cl.
USPC ............................................ 345/211; 345/89
(58) Field of Classification Search
USPC .................................................. 345/211, 98
See application file for complete search history.

(56) References Cited

U.S. PATENT DOCUMENTS

| 7,215,203 B2 | 5/2007 | Matsunaga et al. |
| 2004/0041773 A1 | 3/2004 | Takeda et al. |

FOREIGN PATENT DOCUMENTS

| JP | 6-88955 | 3/1994 |
| JP | 06-188652 | 7/1994 |
| JP | 11-014968 A | 1/1999 |
| JP | 11-194320 | 7/1999 |
| JP | 2001-075540 | 3/2001 |
| JP | 2001-282197 | 10/2001 |
| JP | 2002-041003 A | 2/2002 |
| JP | 2002-99254 | 4/2002 |
| JP | 2004-69848 | 3/2004 |
| JP | 2004-258486 A | 9/2004 |
| JP | 2004-287466 | 10/2004 |
| JP | 2004-309193 | 11/2004 |
| JP | 2007-93696 | 4/2007 |

OTHER PUBLICATIONS

Office Action issued Aug. 16, 2012 in Japanese Application No. 2008-113622 (w/partial English translation).
Japanese Decision of Refusal issued on Dec. 18, 2012 in Patent Application No. 2008-113622 with partial English Translation.
Office Action issued Aug. 6, 2013 in Japanese Patent Application No. 2013-016306 (with English language translation).
Office Action issued Nov. 19, 2013 in Japanese Patent Application No. JP2013-016306 with English-language translation.

*Primary Examiner* — Amare Mengistu
*Assistant Examiner* — Shawna Stepp Jones
(74) *Attorney, Agent, or Firm* — Oblon, Spivak, McClelland, Maier & Neustadt, L.L.P.

(57) ABSTRACT

A potential generation circuit and a liquid crystal display device are provided that are capable of reducing power consumption with a simple circuit configuration. The potential generation circuit is a potential generation circuit for generating a common potential that is applied to a capacitive load, and includes a differential amplifier that has a positive input receiving a given set potential and a negative input receiving the common potential that is negatively fed back, a current amplifier that amplifies the output of the differential amplifier and outputs the common potential, a charge recovery capacitor that has one of its ends connected to a reference potential, and an anti-parallel diode that is connected between the other end of the charge recovery capacitor and the common potential.

5 Claims, 5 Drawing Sheets

POTENTIAL GENERATION CIRCUIT AND LIQUID CRYSTAL DISPLAY DEVICE

CROSS-REFERENCE TO RELATED APPLICATIONS

This application is a division of and claims benefit of priority under 35 U.S.C. §120 from U.S. Ser. No. 12/429,534 filed Apr. 24, 2009, the entire contents of which are incorporated herein by reference.

BACKGROUND OF THE INVENTION

1. Field of the Invention

The present invention relates to a liquid crystal display device and, in particular, to a potential generation circuit in an active matrix liquid crystal display device.

2. Description of the Background Art

Drive schemes for active matrix liquid crystal display devices are roughly divided into two groups from the viewpoint of a common potential. The first one is generally called a line common inversion scheme where the polarity of the common potential is inverted every other gate line of a liquid crystal display device, and the polarities of the potentials of all data lines are inverted according to the polarity of the common potential. Here, the polarity inversion period may be every other multiple number of lines or may be every frame. The other one is generally called a dot inversion scheme where the common potential is kept constant at a DC potential and the polarities of the potentials of data lines are inverted with reference to the common potential. Although polarity is typically inverted so that adjacent pixels are provided with different polarities, it may be inverted every other multiple number of pixels.

For instance, for the case in the line common inversion scheme where the polarity of an applied voltage is inverted every other gate line of a normally white liquid crystal display device, the applied voltage attains a maximum value when the display provides a full black screen, and at that time a current consumed by a potential generation circuit (hereinafter referred to as a "common potential generation circuit") is also at its maximum. On the other hand, in the dot inversion scheme, when the display provides a full black or white screen, potentials between adjacent pixels are cancelled out, so that a common potential generation circuit consumes little current. However, for example when adjacent pixels are displayed as black and white (typical adjacent pixels have different RGB colors, so adjacent pixels are actually displayed as purple, green, purple, and so on), the common potential generation circuit consumes more power as in the case of the line common inversion scheme. In the dot inversion scheme, polarity is averaged during display of a typical image, so that power consumption by the common potential generation circuit tends to be generally smaller than in the case of the line common inversion scheme.

Conventionally, there is a method that uses a charge recovery circuit in the line common inversion scheme so as to reduce power consumption by the common potential generation circuit that would consume a large amount of power (see, for example, Japanese Patent Application Laid-open No. 2004-69848.) There is also another method for reducing power consumption by the common potential generation circuit (see, for example, Japanese Patent Application Laid-open Nos. 2007-093696, 11-194320, 2001-282197, and 06-088955.)

Such conventional common potential generation circuits either fail to achieve sufficiently low power consumption or achieve low power consumption but only with a complicated circuit configuration.

SUMMARY OF THE INVENTION

It is an object of the present invention to provide a potential generation circuit and a liquid crystal display device that are capable of reducing power consumption with a simple circuit configuration.

A potential generation circuit according to the present invention is a potential generation circuit for generating an output potential that is applied to a capacitive load, and includes a differential amplifier that has a positive input receiving a given set potential and a negative input receiving the output potential that is negatively fed back, wherein the output potential is output in response to the output of the differential amplifier. The potential generation circuit further includes a charge recovery capacitor that has one of its ends connected to a stable potential, and an anti-parallel diode that is connected between the other end of the charge recovery capacitor and the output potential.

According to the present invention, both the provision of the differential amplifier that has a positive input receiving a given set potential and a negative input receiving the output potential that is negatively fed back, wherein the output potential is output in response to the output of the differential amplifier; and the provision of a charge recovery capacitor that has one of its ends connected to a stable potential and an anti-parallel diode that is connected between the other end of the charge recovery capacitor and the output potential differential amplifier allow a reduction in power consumption with a simple circuit configuration.

These and the other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are now described with reference to the drawings.

First of all, a technique that is the premise of the present invention is described.

Figure 5:
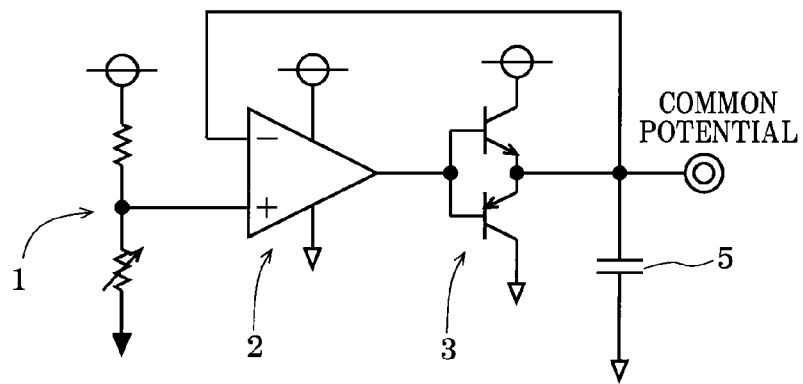
FIG. 5 is a schematic configuration diagram of a conventional common potential generation circuit.

FIG. 5 is a schematic configuration diagram of a conventional common potential generation circuit. Such a circuit configuration as illustrated in FIG. 5 is a common potential generation circuit driven by the currently commonly used dot inversion scheme, and includes a potential regulator 1 that determines a DC potential, a voltage-follower connected differential amplifier 2, a current amplifier 3, and a smoothing capacitor (Cs) 5. The common potential generation circuit in FIG. 5 operates such that, when a common potential is different from the potential of a positive feedback terminal of the differential amplifier 2, the differential amplifier 2 operates at an inverse voltage (i.e., the differential amplifier 2 operates negatively when the difference is positive and operates positively when the difference is negative), and current flows from the current amplifier 3 to the smoothing capacitor 5 at the common potential so that charge is accumulated (or charge is drawn from the smoothing capacitor 5), whereby the common potential becomes equal to the potential of the potential regulator 1. Although, in practice, other elements, such as a phase adjuster and the like, may be provided additionally, such elements are not shown herein for the sake of simplifying the drawing. It may also be the case that the current capability is sufficient with only the last buffer of the differential amplifier 2, so that the individual provision of the current amplifier 3 is not required; in the drawing, the current amplifier 3 is shown separately for ease of understanding.

Figure 6:
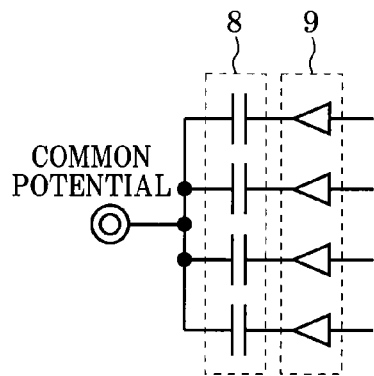
FIG. 6 illustrates an equivalent circuit on the LCD panel side according to a preferred embodiment of the present invention.

FIG. 6 illustrates a typical equivalent circuit on the LCD panel side. Data-line driving circuits 9 output, to their corresponding data lines, image data or a voltage that is output by a polarity inversion signal on an LCD panel. Each data line is connected to a corresponding pixel electrode through a switching element such as a TFT (Thin Film Transistor), and each pixel electrode is connected to the common potential via a liquid crystal capacitor.

Note that each data line is not only connected to each pixel but also directly and parasitically capacitively coupled to the common potential, but in the present invention, although this capacitive coupling is actually the dominant coupling mechanism, each data line and the common potential shall be coupled to each other via some sort of capacitor (Cp) 8. Moreover, although an actual equivalent circuit on the LCD panel side has a more complicated configuration, in the drawing only those elements that are necessary for description are shown for the sake of simplifying the drawing. While FIG. 6 illustrates four data-line driving circuits 9, the actual number of data-line driving circuits is equal to the number of data lines (e.g., a VGA (Video Graphics Array) panel includes 640×RGB=1920 data lines).

As described previously, when the voltages of one half of the data-line driving circuits 9 increase and those of the other half decrease by the same voltage, since each charge is cancelled out when each capacitor has the same value, the common potential remains unchanged and little power is consumed by the common potential generation circuit (it is assumed that there is no current other than the current that passes through the current amplifier 3). However, when an average change in the output potentials of the data-line driving circuits 9 is in the same potential direction, each charge cannot be cancelled out so that the common potential changes. Thus, the common potential generation circuit consumes power in order to reduce the amount of change in the common potential.

Figure 7:
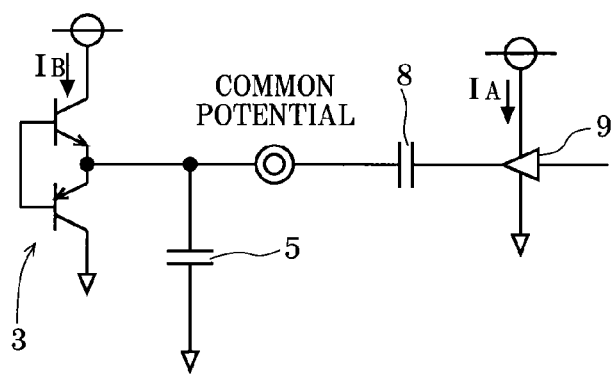
FIG. 7 is a schematic configuration diagram of a conventional common potential generation circuit and an equivalent circuit on the LCD panel side that are connected to each other.
Figure 8:
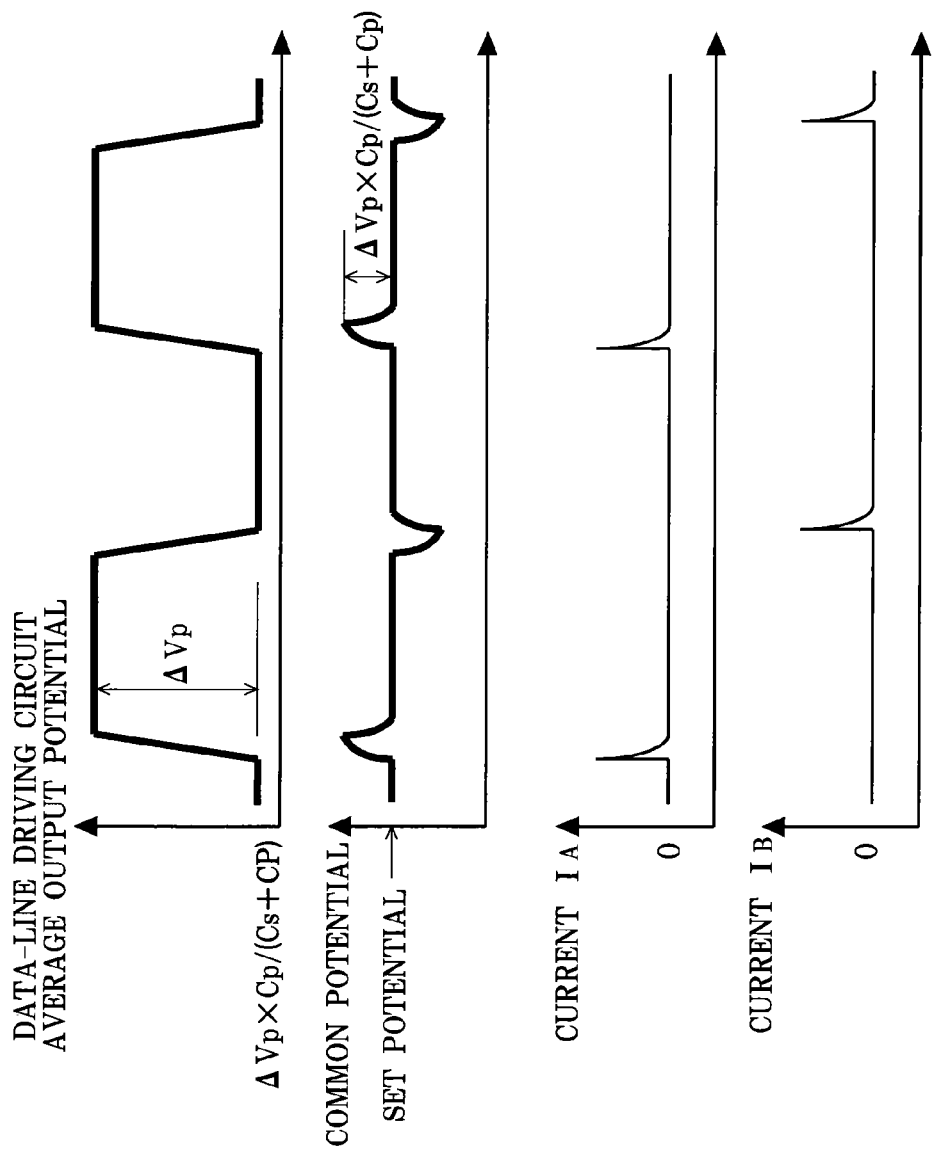
FIG. 8 shows the relationship between voltage and current in a conventional common potential generation circuit.

FIG. 7 is a schematic configuration diagram of such a conventional common potential generation circuit and an equivalent circuit on the LCD panel side that are connected to each other. On the common potential generation circuit side, only the current amplifier 3 is shown for the sake of simplifying the drawing. FIG. 8 shows the relationship between voltage and current in such a conventional common potential generation circuit. As illustrated in FIGS. 7 and 8, when the outputs of the data-line driving circuits 9 change on average by $\Delta Vp$ in the positive direction, the common potential changes by approximately $\Delta Vp \times Cp/(Cs+Cp)$ because the common potential generation circuit cannot respond instantaneously. Along with this potential change, the differential amplifier 2 turns a lower (PNP) transistor of the current amplifier 3 ON so as to draw charge from the smoothing capacitor (Cs) 5 and thereby lower the common potential. At this time, current flows from the side of the data-line driving circuits 9 to the side of the common potential generation circuit, which results in consumption of current $I_A$ from the power supply. On the other hand, when the outputs of the data-line driving circuits 9 change on average by $-\Delta Vp$ in the negative direction, the common potential changes by approximately $-\Delta Vp \times Cp/(Cs+Cp)$ because the common potential generation circuit cannot respond instantaneously. Along with this potential change, the differential amplifier 2 turns an upper (NPN) transistor of the current amplifier 3 ON so as to charge the smoothing capacitor (Cs) 5 and thereby increase the common potential. At this time, current flows from the side of the common potential generation circuit to the side of the data-line driving circuits 9, which results in consumption of current $I_B$ from the power supply.

From the above, concerning the power consumed by the common potential generation circuit, when an average potential that is output from the data-line driving circuits 9 is lowered, current $I_B$ is consumed so as to increase the common potential. Thus, the larger current $I_B$ is, the larger the power consumption by the common potential generation circuit is. The present invention intends to reduce the amount of current $I_B$ and thereby reduce the power consumed by the common potential generation circuit. Now, preferred embodiments of the present invention are described in detail.

First Preferred Embodiment

Figure 1:
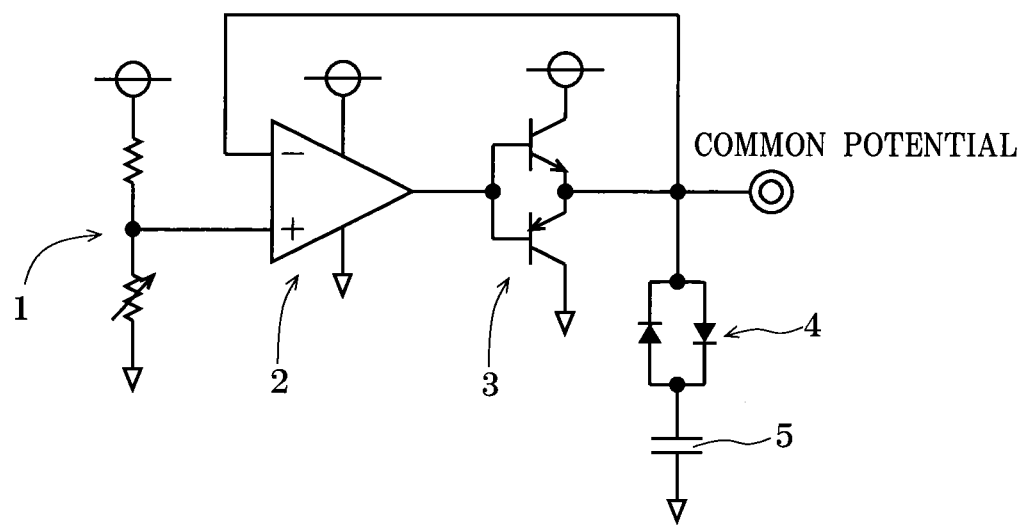
FIG. 1 is a schematic configuration diagram of a common potential generation circuit according to a first preferred embodiment of the present invention.

FIG. 1 is a schematic configuration diagram of a common potential generation circuit according to a first preferred embodiment of the present invention. As illustrated in FIG. 1, it is a potential generation circuit (common potential generation circuit) for generating an output potential (common potential) that is applied to a capacitive load, and includes a differential amplifier 2 that has a positive input receiving a given set potential and a negative input receiving the output potential that is negatively fed back, a current amplifier 3 that amplifies the output of the differential amplifier 2 and outputs the output potential so that the output potential is output in response to the output of the differential amplifier 2, a charge recovery capacitor 5 that has one of its ends connected to a reference potential (stable potential), and an anti-parallel diode 4 that is connected between the other end of the charge recovery capacitor 5 and the output potential.

Although a reference potential is used in the present preferred embodiment, it may be any voltage as long as it is a stable current potential (stable potential). The "smoothing capacitor" as used in the common potential generation circuit is, in the present preferred embodiment, referred to as a charge recovery capacitor.

Figure 2:
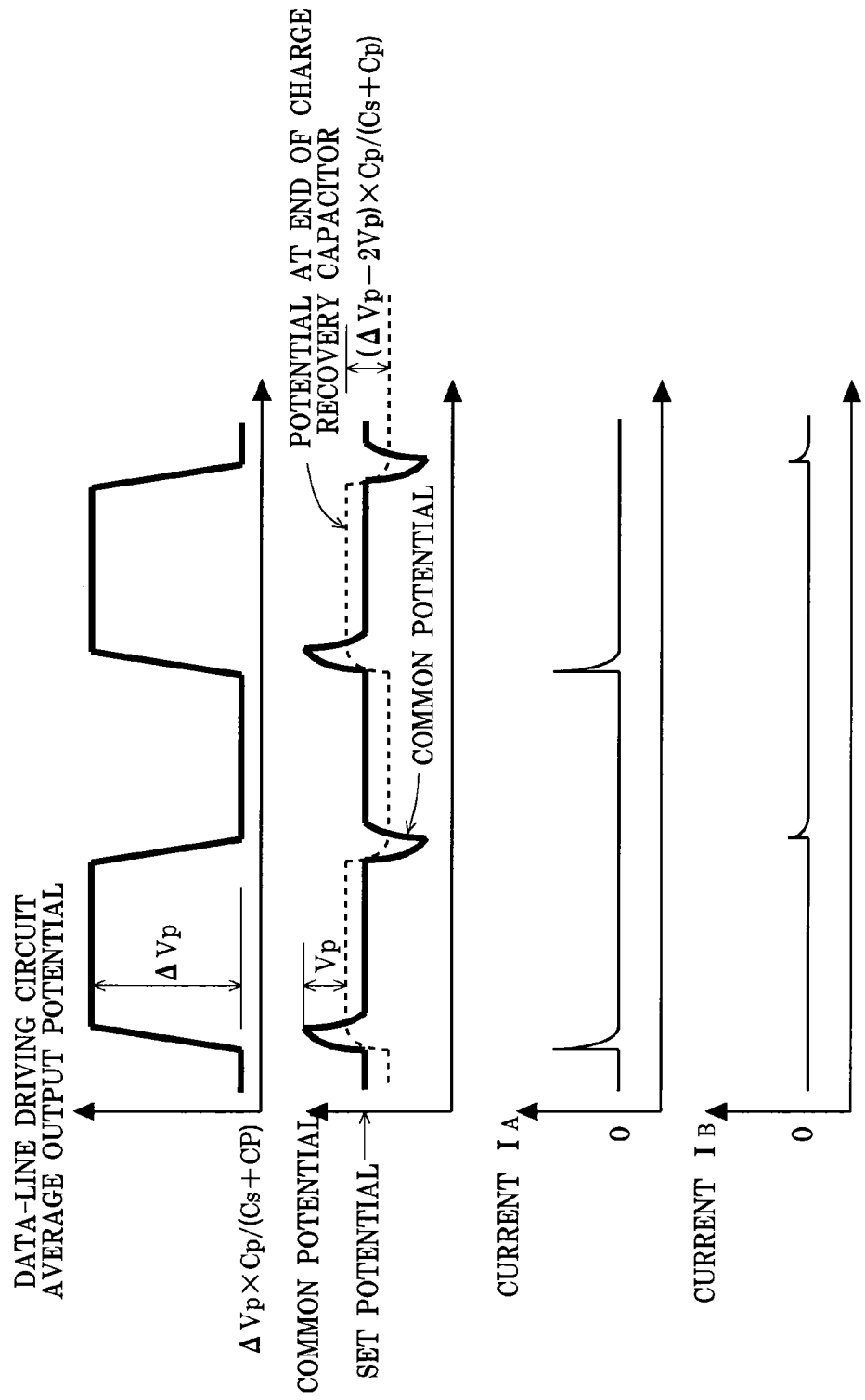
FIG. 2 shows the relationship between voltage and current in the common potential generation circuit according to the first preferred embodiment of the present invention.

FIG. 2 shows the relationship between voltage and current in the common potential generation circuit according to the first preferred embodiment of the present invention. The operation of the common potential generation circuit is described referring to FIGS. 1 and 2.

When an average potential of the data-line driving circuits 9 increases by $\Delta Vp$, during the period until the current amplifier 3 starts its operation, i.e., until the output voltage of the differential amplifier 2 changes in the opposite direction to the direction of change in the common potential and, thereby, the current amplifier 3 being biased, the common potential continues to increase, and a potential difference between the common potential and a potential at the end of the charge recovery capacitor 5 becomes a forward voltage $V_F$ of the diode 4. At this time, if the current amplifier 3 does not operate for a sufficiently long period of time, the current flowing through the diode 4 becomes nearly zero, whereby the potential at the end of the charge recovery capacitor 5 becomes almost constant, so that the forward voltage $V_F$ of the diode 4 is settled at the forward voltage characteristic of the diode at the current value of nearly zero.

Then, the current amplifier 3 starts the operation of lowering the common potential (i.e., turns its PNP transistor ON) so as to converge the increased common potential to a desired potential. At this time, because of the forward voltage characteristic of the diode 4, no charge is drawn from the charge recovery capacitor 5, so that the potential at the end of the charge recovery capacitor 5 remains unchanged and the charge recovery capacitor 5 is in an electrically disconnected state. In other words, the charge recovery capacitor 5 is in its charged state.

Next, when the average potential of the data-line driving circuits 9 decreases by $\Delta Vp$, during the period until the current amplifier 3 starts its operation, the common potential continues to decrease so that a potential difference between the common potential and the potential at the end of the charge recovery capacitor 5 becomes the forward voltage $V_F$ of the diode 4. At this time, if the current amplifier 3 does not operate for a sufficiently long period of time, the charge accumulated in the charge recovery capacitor 5 is discharged and starts to flow through the diode 4, and continues to flow until the potential difference across the diode 4 becomes nearly zero. This charge flowing from the charge recovery capacitor 5 increases the lowered common potential. When the current flowing through the diode 4 becomes almost zero, the potential at the end of the charge recovery capacitor 5 becomes constant, so that the forward voltage $V_F$ of the diode 4 is settled at the forward voltage characteristic of the diode at the current value of nearly zero.

Then, after the common potential is increased by the charge on the charge recovery capacitor 5, the current amplifier 3 starts the operation of increasing the common potential (i.e., turns its NPN transistor ON) so as to compensate for the amount of potential that is further required to attain a desired common potential, whereby the common potential is increased by an insufficient amount to the desired potential. At this time, because of the forward voltage characteristic of the diode 4, the potential at the end of the charge recovery capacitor 5 remains unchanged and the charge recovery capacitor 5 is in an electrically disconnected state.

As illustrated in FIG. 2, when the average potential that is output from the data-line driving circuits 9 changes periodically by $\pm \Delta Vp$, the amplitude of the potential at the end of the charge recovery capacitor 5 is $(\Delta Vp-2V_F) \times Cp/(Cs+Cp)$, and the center of that amplitude is a set potential. In other words, when the average potential changes by $\Delta Vp$ in the positive direction, the potential at the end of the charge recovery capacitor 5 increases by $(\Delta Vp-2V_F) \times Cp/2(Cs+Cp)$ with reference to the set potential, and the peak of the common potential increases by $(\Delta Vp-2V_F) \times Cp/2(Cs+Cp)+V_F$.

As described above, the common potential generation circuit consumes power (i.e., current $I_B$ flows) when the average output potential of the data-line driving circuits 9 decreases.

Conventionally, when the average output potential of the data-line driving circuits 9 decreases by $\Delta Vp$, the amount of charge that is required to restore the changed common potential to its original value is $\Delta Vp \times Cp$. That is, although the actual amount of change in the common potential is approximately $\Delta Vp \times Cp/(Cs+Cp)$, since the total capacitance at the common potential part is $Cs+Cp$, the amount of charge required to restore the changed common potential to its original value is $\{\Delta Vp \times Cp/(Cs+Cp)\} \times (Cs+Cp) = \Delta Vp \times Cp$.

On the other hand, in the first preferred embodiment of the present invention, the amount of change in the common potential is $(\Delta Vp-2V_F) \times Cp/2(Cs+Cp)+V_F$, and the charge recovery capacitor (Cs) 5 is electrically disconnected by the diode 4, so that the total capacitance at the common potential part is Cp. Thus, the amount of charge required to restore the changed common potential to its original value is $\{(\Delta VP-2V_F) \times Cp/2(Cs+Cp)+V_F\}Cp$.

Here, if $\Delta Vp > 2V_F$, the amount of charge, $\{(\Delta Vp-2V_F) \times Cp/2(Cs+Cp)+V_F\}Cp$, that is required to restore the common potential to its original value always becomes smaller than $\Delta Vp \times Cp$, from which it is evident that the amount of current consumed by the common potential generation circuit according to the first preferred embodiment of the present invention is reduced.

Conventionally, when the average output potential changes by $\Delta Vp$ in the positive direction, charge is drawn through the PNP transistor of the current amplifier 3. However, in the first preferred embodiment of the present invention, charge is accumulated on the charge recovery capacitor 5 and such accumulated charge on the charge recovery capacitor 5 is reused for a change of the average output potential by $\Delta Vp$ in the negative direction. The above operation can be achieved with a simple configuration.

Further, when $\Delta Vp < 2V_F$, the diode 4 is not conducting so that the potential at the end of the charge recovery capacitor 5 has no amplitude. It is equivalent to the case where the circuit in itself does not exist. Thus, as in the conventional case, the amount of charge required to restore the common potential to its original value is $\Delta Vp \times Cp$ and this value never becomes larger than the conventional value.

In the above description, the characteristics of current flowing through the diode 4 and the dynamic characteristics of the differential amplifier 2 are disregarded. Assuming that current is less prone to flow into the diode 4 and the differential amplifier 2 has a high slew rate, the common potential changes along with a change in the average output potential by $\Delta Vp$, and the charge recovery capacitor 5 starts to be charged or discharged through the diode 4; however, before the charge recovery capacitor 5 is sufficiently charged or discharged, the differential amplifier 2 that operates fast biases the current amplifier 3 and thereby restores the common potential to the set potential. This inhibits sufficient recovery or reuse of charge, thereby reducing the effect of reducing current (or power) consumption by the common potential generation circuit. To enhance the effect of reducing power consumption by the common potential generation circuit, the capacitance of the charge recovery capacitor 5 may be increased, a diode 4 with low $V_F$ and high $I_F$ may be used so as to speed up charge or discharge of the charge recovery capacitor 5 as fast as possible, and a differential amplifier 2 that has a low slew rate within a required range may be selected. Or, if it is difficult to control the slew rate of the differential amplifier 2, although its configuration and control may become somewhat complicated, a differential amplifier 2 that is equipped with invalid functions or the like may be used and its operation may be stopped during a certain period after a change in the average output potential of the data-line driving circuits 9.

Second Preferred Embodiment

In general, power supply voltages used within a liquid crystal display device driven by the dot inversion scheme include a logic circuit potential, a gate-on potential, a gate-off potential, an analog potential, a common potential, and the like, and in many cases, they are set approximately as follows: logic circuit potential=3.3 V, gate-on potential=20 V, gate-off potential=−5 V, analog potential=10 V, and common potential=4 V. A second preferred embodiment of the present invention is described using each of the above voltage values; these power supplies are generated from either a single input power supply potential or a plurality of power supply potentials. As the input power supply potential, approximately 3.3 V is mainly used, but because power consumption increases with the increasing size of a liquid crystal display device, it tends to be higher such as 5 V, 12 V, and so one. The present preferred embodiment describes the case using, for example, a single input supply potential of 3.3 V.

An analog potential is used as a power supply for the data-line driving circuits 9, and the data-line driving circuits 9 are connected between the analog power supply potential and a reference potential (GND) and are capable of outputting any given voltage between, for example, 1 and 9 volts. The common potential is set to approximately 4V, and an analog potential of 10V is used for three power supplies that are provided in a conventional common potential generation circuit as illustrated in FIG. 5. In such a conventional common potential generation circuit, current $I_B$ (A) illustrated in FIG. 8 is consumed from the power supply potential of 10V; therefore, power consumption is $10 \times I_B$ (W).

Figure 3:
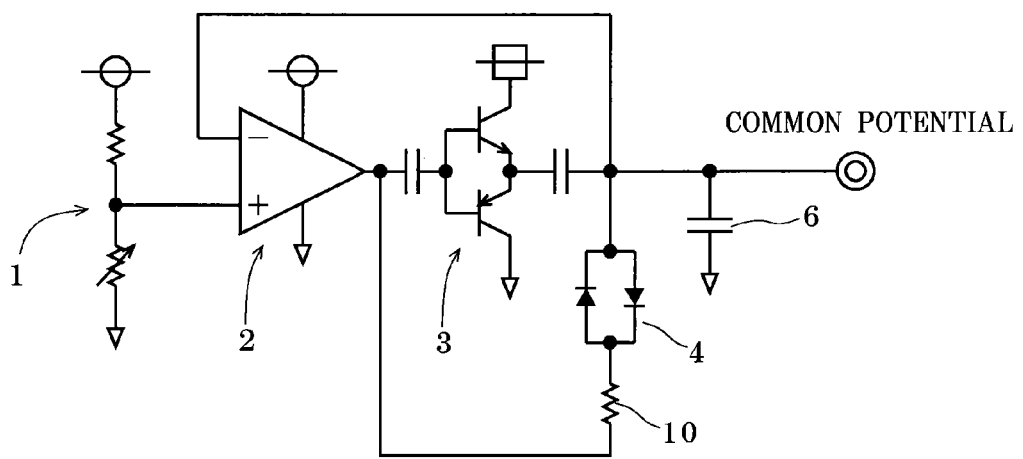
FIG. 3 is a schematic configuration diagram of a common potential generation circuit according to a second preferred embodiment of the present invention.

FIG. 3 is a schematic configuration diagram of a common potential generation circuit according to a second preferred embodiment of the present invention. As illustrated in FIG. 3, it is a potential generation circuit (common potential generation circuit) for generating an output potential (common potential) that is applied to a capacitive load, and includes a differential amplifier 2 that has a positive input receiving a given set potential and a negative input receiving the output potential that is negatively fed back, a current amplifier 3 that inputs and amplifies the output of the differential amplifier 2 by capacitive coupling and outputs the output potential by capacitive coupling, and a DC-biasing unit that DC-biases the output potential. The DC-biasing unit includes a resistor 10 and a diode 4 (anti-parallel diode) that are connected in series between the output of the differential amplifier 2 and the output potential. In the second preferred embodiment of the present invention, the potential that is connected to both the differential amplifier 2 and the potential regulator 1 is an analog potential of 10 V, and only the current amplifier 3 is connected not to the analog potential but to a logic circuit potential of 3.3 V. Each capacitance connected to the current amplifier 3 is sufficiently large.

The common potential generation circuit illustrated in FIG. 3 is now described.

An initial value of the common potential is set to, for example, 0V, as a voltage immediately after power-on. Since the set voltage for the potential regulator 1 is 4V, the differential amplifier 2 increases its output voltage. Increasing the output voltage of the differential amplifier 2 causes the current amplifier 3 to be biased, but because the power supply voltage connected to the current amplifier 3 is 3.3V, the common potential can be increased only up to a maximum of 3.3V. However, charge is supplied from the output end of the differential amplifier 2 through the series-connected resistor 10 and diode 4, so that the common potential is increased to the set potential.

As in the first preferred embodiment, a change in the average output potential of the data-line driving circuits 9 causes a change in the common potential. At this time, the differential amplifier 2 outputs a potential in the reverse direction to the direction of potential change; however, when the output potential is less than the forward voltage $\pm V_F$ of the diode 4 with respect to the common potential, no current will flow. On the other hand, when the output potential is slightly larger than the forward voltage $V_F$ with respect to the common potential, current starts to flow through the resistor 10 and the diode 4 that are connected in series from the output end of the differential amplifier 2; however, the flow of current is somewhat limited because of the presence of the resistor. However, at the same time, the base of the current amplifier 3 starts to be biased and thereby large current starts to flow from the current amplifier 3. As a result, the capacitively coupled common potential is increased and settled at the set potential.

In this way, in such a common potential generation circuit as illustrated in FIG. 3, the resistor 10 and the diode 4 that are connected in series from the output end of the differential amplifier 2 are provided so as to bias the DC current, and the current amplifier 3 is provided so as to restore and correct the changed common potential to its original value. Since, as illustrated in FIG. 6, the common potential and the data-line driving circuits 9 are connected via the capacitors (Cp) 8, DC current will never flow toward the data-line driving circuits 9 (but in practice, there exists an extremely small leakage current). Thus, current $I_B$ shown in FIG. 8 is used to reduce variations in the common potential and is consumed by the common potential generation circuit. Although a bias current of the differential amplifier 2 or the like is also consumed, the description thereof is omitted herein.

In a conventional common potential generation circuit, current $I_B$ is consumed from the analog-potential power supply of 10 V, so that power consumption is $10 \times I_B$ (W). In the second preferred embodiment of the present invention, on the other hand, power consumption is $3.3 \times I_B$ (W) because current $I_B$ is consumed from the potential power supply of 3.3 V, from which it is evident that power consumption is reduced more than in the conventional case. The above description is based on the assumption that no current flows from the output of the differential amplifier 2 to the common potential; in the current amplifier 3, there is a flow of current of only approximately $I_B$/Transistor $h_{FE}$, and on the path of the resistor 10 and the diode 4 that are connected in series from the output end of the differential amplifier 2, current is less prone to flow due to the forward voltage of the diode and because of the presence of the resistor, so that such current flow can be almost disregarded.

Now, the resistor 10 and the diode 4 that are connected in series from the output end of the differential amplifier 2 are described. Assuming that no diode 4 is provided, even a slight shift in the output potential of the differential amplifier 2 from the common potential will cause a flow of current; such a current is supplied from the analog potential of 10 V, thus increasing power consumption. This can be prevented by increasing the value of the series-connected resistor 10; however, since, for example at power-on, a DC potential is biased via the resistor 10, stabilization takes time. The above problem can be solved with such a circuit configuration as illustrated in FIG. 3 in which the resistor 10 and the diode 4 are connected in series.

While a power supply of 0 to 3.3 V is used as the power supply for the current amplifier 3 according to the second preferred embodiment of the present invention, a power supply of, for example, 3.3 to 10 V may be used instead. For instance, in such a case where 2.5 V is generated by another circuit such as a logic circuit potential, power consumption can be further reduced by using a power supply of 0 to 2.5 V. In other words, capacitive coupling of the current amplifier 3 to the common potential allows selection of the most efficient potential, thereby achieving lower power consumption.

In the common potential generation circuit in FIG. 3, the power supply for the differential amplifier 2 is set to 10 V to allow convenient determination of the DC value. However, in the common potential generation circuit in FIG. 4, the same power supply of 3.3 V for the current amplifier 3 can be used for both the potential regulator 1 and the differential amplifier 2.

Figure 4:
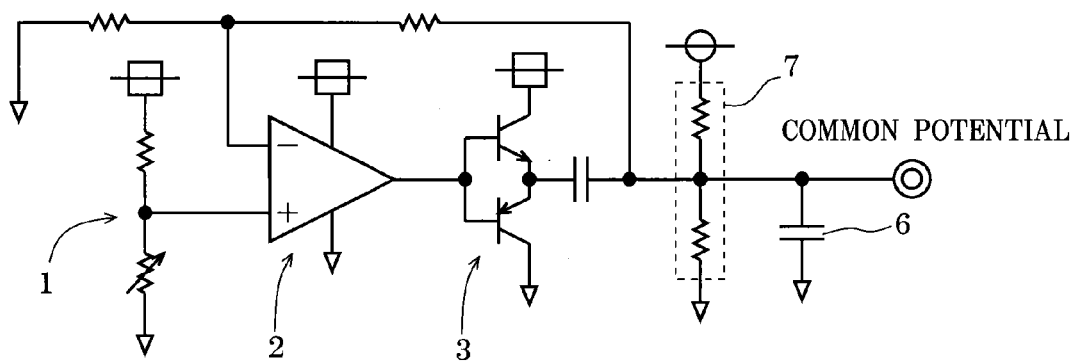
FIG. 4 is a schematic configuration diagram of another common potential generation circuit according to the second preferred embodiment of the present invention.

FIG. 4 is a schematic configuration diagram of another common potential generation circuit according to the second preferred embodiment of the present invention. As illustrated in FIG. 4, it is a potential generation circuit (common potential generation circuit) for generating an output potential (common potential) that is applied to a capacitive load, and includes a differential amplifier 2 that has a positive input receiving a given set potential and a negative input receiving the output potential that is negatively fed back, a current amplifier 3 that amplifies the output of the differential amplifier 2 and outputs the output potential by capacitive coupling so that the output potential is output by capacitive coupling in response to the output of the differential amplifier 2, and a DC-biasing unit that DC-biases the output potential. The DC-biasing unit includes a circuit that divides a potential between first and second power supplies by resistance. In the present preferred embodiment, a logic circuit power supply potential of 3.3 V is used for the potential regulator 1, the differential amplifier 2, and the current amplifier 3, and an analog power supply potential is used for the DC-biasing unit.

If, in this case, no DC-biasing unit 7 is provided, the other circuits alone cannot have any biasing means to obtain a desired DC potential of 4V, so that some sort of unit is needed. The simplest biasing unit is a resistance type potential divider as illustrated in FIG. 4; in the case of FIG. 4, an analog potential of 10 V is first divided by the resistance and then biased to the common potential. At this time, current continues to flow steadily and, thereby, power is consumed, so that, although it is not preferable, such steadily consumed power may be reduced by increasing the resistance value only if the rise time at power-on is somewhat slow. Or, another biasing unit may be used. Since the power supply of the differential amplifier 2 and the potential regulator 1 is 3.3V, the set potential (4V) of the common potential cannot be output directly; however, by using a non-inverting amplifier circuit configuration as illustrated in FIG. 4, it becomes possible to control a potential that is k times (k≥1) the potential at the positive feedback terminal. In FIG. 4, both the differential amplifier 2 and the current amplifier 3 operate within the same potential range, so that they are not necessarily capacitively coupled to each other.

From the above, since the same power supply of 3.3V for the current amplifier 3 is used for both the potential regulator 1 and the differential amplifier 2, the common potential generation circuit can achieve lower power consumption.

The common potential generation circuits in FIGS. 3 and 4 may further include a charge recovery capacitor and an anti-parallel diode that are connected in series to each other as in the first preferred embodiment. More specifically, they may further include the charge recovery capacitor 5 that has one of its ends connected to a reference potential (stable potential), and the anti-parallel diode 4 that is connected between the other end of the charge recovery capacitor 5 and the output potential (common potential) (not shown). This further reduces power consumption.

The potential generation circuits described in the above first and second preferred embodiments are both applicable to a liquid crystal display device as a circuit for generating a common potential. A liquid crystal display device equipped with the common potential generation circuit described in the first or second preferred embodiment can achieve lower power consumption.

While the invention has been shown and described in detail, the foregoing description is in all aspects illustrative and not restrictive. It is therefore understood that numerous modifications and variations can be devised without departing from the scope of the invention.

What is claimed is:

1. A potential generation circuit for generating an output potential that is applied to a capacitive load, comprising:
   a differential amplifier that has a positive input receiving a given set potential and a negative input receiving said output potential that is negatively fed back,
   wherein said output potential is output by capacitive coupling in response to an output of said differential amplifier,
   the potential generation circuit further comprising:
   a DC-biasing unit that DC-biases said output potential.

2. The potential generation circuit according to claim 1 further comprising a current amplifier that amplifies the output of said differential amplifier and outputs said output potential by capacitive coupling.

3. The potential generation circuit according to claim 1, wherein said DC-biasing unit includes a circuit that divides a potential between first and second power supplies by resistance.

4. The potential generation circuit according to claim 1, further comprising:
   a charge recovery capacitor that has one of its ends connected to a stable potential; and
   an anti-parallel diode that is connected between the other end of said charge recovery capacitor and said output potential.

5. A liquid crystal display device comprising the potential generation circuit according to claim 1 as a circuit for generating a common potential.

* * * * *